310-322 [redacted] SR
8/16/77 OR 4,042,845

United States Patent [19]

Hackett

[11] 4,042,845

[45] Aug. 16, 1977

[54] TRANSDUCER ASSEMBLY AND METHOD FOR RADIATING AND DETECTING ENERGY OVER CONTROLLED BEAM WIDTH

[75] Inventor: Kenneth R. Hackett, Boulder, Colo.

[73] Assignee: Sontrix Division of Pittway Corporation, Boulder, Colo.

[21] Appl. No.: 670,275

[22] Filed: Mar. 25, 1976

[51] Int. Cl.[2] .................... H01L 41/04

[52] U.S. Cl. .................... 310/322; 310/368

[58] Field of Search .................... 310/8, 8.2, 8.3, 8.5, 310/8.6, 9.1, 9.4; 340/8 R, 8 FT, 8 L, 9, 10, 11, 12, 13; 350/294; 343/837, 838, 840, 910, 914; 73/194 E; 179/110 A

[56] References Cited

U.S. PATENT DOCUMENTS

| | | | |
|---|---|---|---|
| 2,567,407 | 9/1951 | Slaymaker | 340/8 FT |
| 2,580,439 | 1/1952 | Kock | 340/8 FT |
| 3,331,970 | 7/1967 | Dundon et al. | 310/8.2 X |
| 3,748,502 | 7/1973 | Bernstein | 310/8 |
| 3,860,838 | 1/1975 | Kumon | 310/8.2 X |
| 3,873,866 | 3/1975 | Goble | 310/8.2 X |
| 3,965,455 | 6/1976 | Hurwitz | 310/8.2 X |

*Primary Examiner*—Mark O. Budd
*Attorney, Agent, or Firm*—Max L. Wymore

[57] ABSTRACT

A transducer assembly capable of radiating and detecting energy over a controlled beam width around a selected axis is formed by a piezoelectric element mounted in a cylindrical resonant cavity defined by a Helmholtz chamber. The resonant chamber has an energy emitting end wall positioned normal to the selected axis and is arranged to have a single aperture ring which emits energy symmetrically around the axis at a predetermined radial offset distance therefrom. The energy emitted from the chamber through the end wall sums to form along and around the selected axis a beam-like pattern of controlled width, the beam width being controllable as a function of the offset distance and the energy wavelength. In one embodiment, circular apertures which operate to emit spherical radiation patterns are formed in the chamber end wall. In another embodiment, an annular aperture is formed in the chamber end wall concentric with the selected axis.

29 Claims, 6 Drawing Figures

TRANSDUCER ASSEMBLY AND METHOD FOR RADIATING AND DETECTING ENERGY OVER CONTROLLED BEAM WIDTH

BACKGROUND OF THE INVENTION

The present invention relates to transducer assemblies, and methods for radiating and detecting energy over a controlled beam width.

Transducer assemblies employing piezoelectric elements which radiate and sense acoustical energy at ultrasonic frequencies are commonly employed in detection systems to monitor areas to be protected. Due to differences in the shapes and sizes of individual areas to be monitored, it is desirable to be able to control the beam width over which energy can be radiated and detected by such transducer assemblies. Heretofore, it has generally been necessary to employ external reflectors or focusing surfaces in order to achieve such beam width control. An example of such a transducer assembly employing external reflecting surfaces is illustrated in assignee's copending U.S. patent application Ser. No. 471,280, filed May 20, 1974, entitled "PIEZOELECTRIC TRANSDUCER ASSEMBLY AND METHOD FOR GENERATING A CONE SHAPED RADIATION PATTERN."

SUMMARY OF THE INVENTION

It is, accordingly, an object of the present invention to provide an improved transducer assembly suitable for use in ultrasonic detection systems capable of radiating and/or detecting acoustical energy over a controlled beam width without the use of external reflectors or focusing surfaces.

It is also an object of the present invention to provide an improved method for radiating and/or detecting acoustical energy over a controlled beam width around and along a selected axis.

It is further an object of the present invention to provide an improved transducer assembly characterized by employing a resonant chamber to achieve enhanced acoustical output and detection sensitivity.

It is additionally an object of the present invention to provide an improved method for radiating and/or detecting acoustical energy characterized by being of enhanced efficiency.

In accomplishing these and other objects, a transducer assembly capable of radiating and detecting energy over a controlled beam width around a selected axis is formed by a piezoelectric element mounted in a cylindrical resonant cavity defined by a Helmholtz chamber. The resonant chamber has an energy emitting end wall structure positioned normal to the selected axis and is arranged to have a single aperture ring which emits energy symmetrically around the axis at a predetermined radial offset distance therefrom. The energy emitted from the chamber through the end wall sums to form along and around the selected axis a beam-like pattern of controlled width, the beam width being controllable as a function of the offset distance and the energy wavelength.

In one embodiment, circular apertures or openings which operate to emit spherical radiation patterns are formed in the chamber end wall to define the single aperture ring. In another embodiment, the single aperture ring is provided by an annular aperture or opening formed in the chamber end wall concentric with the selected axis.

Additional objects reside in the specific construction of the exemplary embodiments of a transducer assembly hereinafter described and their methods of operation.

DETAILED DESCRIPTION OF THE PREFERRED EMBODIMENTS

Figure 1:
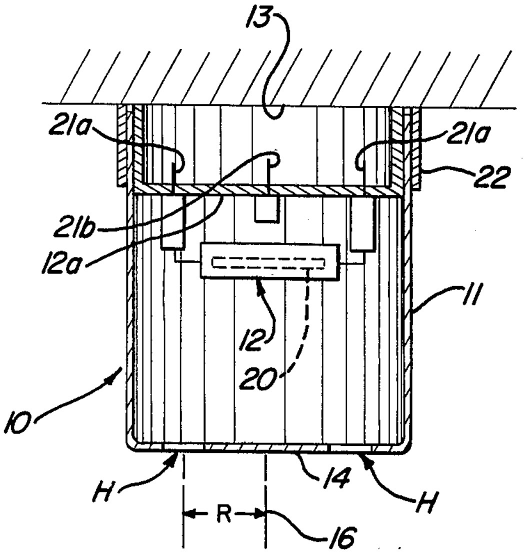
FIG. 1 is a cross-sectional view of a transducer assembly according to the present invention.
Figure 2:
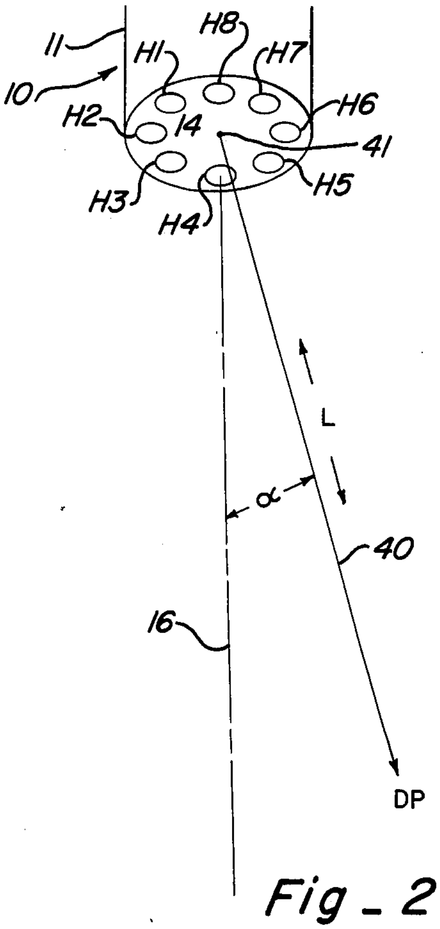
FIG. 2 is a perspective view of the energy emitting end of the assembly of FIG. 1.
Figure 3:
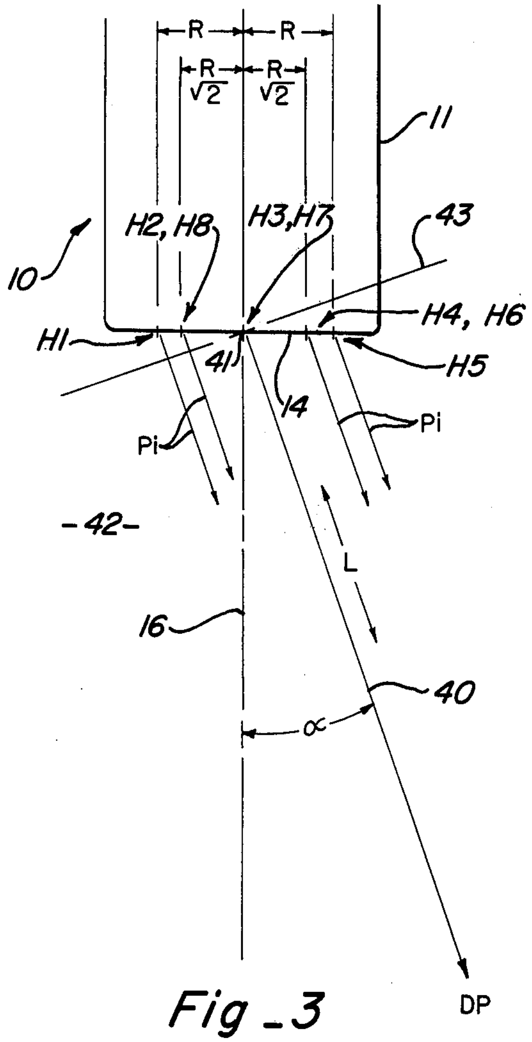
FIG. 3 is a side view of the assembly of FIG. 1.

Referring to the drawings in more detail, there is shown in FIGS. 1—3 a transducer assembly generally identified by the numeral 10. The assembly 10 is made up of a resonant chamber 11 and a transducer 12. The transducer 12 employed may be conventional in construction, as hereinafter discussed, and accordingly, its details are not shown in the drawings.

The chamber 11 is shown mounted on structure 13 and defines a resonant cavity, being of the type commonly referred to as a Helmholtz chamber. As shown in FIG. 1, the base end of the chamber 11 is completely closed by the support **12*a* supporting the transducer 12. The other end of the chamber 11, which may be referred to as the top or energy emitting end, is defined by the chamber end wall 14. As shown in FIGS. 2 and 3, the end wall 14 has a plurality of circular apertures or holes H formed therein in planar alignment which define a single aperture ring. Eight similar openings H are shown, which are designated for purposes of discussion H1–H8. The apertures H are equally spaced apart circumferentially around the longitudinal axis 16 of the chamber 11 in a plane normal thereto. The centerpoints of the apertures H define a circle of radius R concentric with the chamber axis 16. Hence, the centerpoint of each aperture H is offset from the axis 16** the radial distance R.

The chamber end walls defined by the support **12*a* and wall 14 are each positioned normal to the chamber longitudinal axis 16. The cylindrical side wall of the chamber 11 is disposed parallel with the axis 16**.

Mounted within the chamber 11 to extend symmetrically and perpendicularly across its longitudinal axis 16 is the transducer 12. The transducer 12 is mounted upon support **12*a* in a conventional manner and includes a piezoelectric element 20** (shown representatively in dashed lines).

Piezoelectricity is pressure electricity and piezoelectric behavior is the characteristic of materials to deform upon the application of electrical signals or conversely to develop electricity whenever deformed by the application of pressure. Materials exhibiting piezoelectric behavior are naturally occurring or may be man made.

The piezoelectric element employed in the transducer 20 is a flat plate-like bender type, such as the bender type of piezoelectric element made by Clevite Corporation under the name BIMORPH. Further description of the operation of this type of piezoelectric element is given in assignee's aforementioned copending U.S. patent application Ser. No. 471,280, filed May 20, 1974, and is hereby incorporated by reference.

Such a piezoelectric element 20 is generally rectangular in shape and has a circular node about which it flexes or bends. The element edge portions outside of the node always move in the direction opposite to the direction of movement of the element center portion within the node.

The piezoelectric element 20 incorporated in the transducer 12 has a selected, preferably ultrasonic, natural resonant frequency and is mounted in the transducer 12 for free vibration about its node. Included in the transducer 12 is structure which causes the compression and rarefaction waves generated on opposite sides of the node of the piezoelectric element 20 to be phase shifted so as to combine through constructive interference and reinforce each other. Additionally, the piezoelectric element is held in the transducer 12 appropriately spaced from the adjacent surface of support **12*a* so that sound waves generated on opposite sides of the plane of the piezoelectric element 20** are reflected to constructively interfere and hence reinforce each other.

The transducer 12 includes electrical contacts and terminals **21*a* and 21*b* through which electrical signals may be picked off or applied to the opposite faces of the piezoelectric element 20. One suitable manner in which the piezoelectric element 20 may be mounted and held in the transducer 12** is disclosed in U.S. Pat. No. 3,704,385 issued on Nov. 28, 1972 to Schweitzer et al.

When the piezoelectric element 20 is electrically excited at its natural resonant frequency, the transducer 12 operates to generate in the chamber **11*a* spherical radiation pattern. The natural resonant frequency of the element 20** is here assumed to be an ultrasonic resonant frequency, and the wavelength of this resonant frequency is hereinafter referred to as $\lambda$.

The Helmholtz chamber 11 is axially adjustable with respect to the end wall defined by the transducer support **12*a* and is adjusted to define a resonant cavity of appropriate length to have a resonant frequency corresponding to the resonant frequency of the piezoelectric element 20. As a consequence, the acoustical output of the transducer 12 is amplified by the resonant action of the Helmholtz chamber 11 and the chamber 11 functions to improve the transducer to air transfer efficiency. Once the length of the chamber 11 is appropriately adjusted, the chamber 11 is retained in position with respect to the support 12*a* by clamping ring 22.**

The Helmholtz chamber 11 operates to amplify and convert the spherical radiation pattern of ultrasonic energy generated by the transducer 12 along axis 16 into a plurality of substantially spherical radiation patterns 30 which are outputted by the apertures H.

Figure 4:
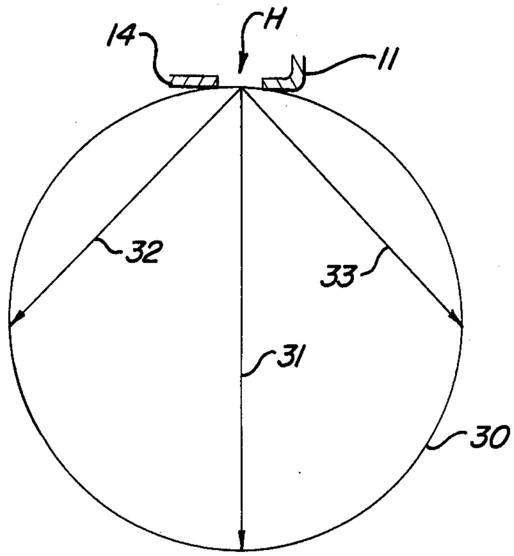
FIG. 4 is a cross-sectonal view of the spherical radiation pattern emitted by a circular aperture in the energy emitting end wall of the assembly of FIG. 1.

FIG. 4 illustrates a cross-sectional view of the spherical radiation pattern 30 emitted by one of the holes H. Sound vectors 31, 32 and 33 are there identified. The vector 31 represents full power and lies parallel to the longitudinal axis 16 of the chamber 11 at the radial offset distance R therefrom. The sound vectors 32 and 33 represent one-half power and lie at 45° angles to the full power vector 31.

It is noted that regardless of where an individual circular aperture is located in the chamber end wall 14 substantially the same output will be emitted therefrom. That is to say, a single circular aperture or hole in the center of the chamber end wall 14 would produce approximately the same output as a similar single hole near the outer periphery of the end wall 14.

Two specific advantages, however, are obtained by utilizing a plurality of apertures in the outer peripheral portion of the end wall 14 instead of employing a single center aperture. One advantage is that by increasing the number of apertures the output, and likewise pickup sensitivity, of the transducer assembly 10 is increased. Secondly, as discussed hereinafter, the advantage is obtained that the beam width of the energy pattern radiated by the transducer assembly can be selectively controlled as a function of the positioning of the apertures H. With a single center aperture, the beam width of the energy pattern radiated is not controllable, except by the use of external reflectors, and would be a spherical radiation pattern like that shown in FIG. 4.

In operation of the transducer assembly 10, the total sound pressure PT radiated thereby to any distant point is equal to the vector sum at the distant point of the individual ultrasonic pressure waves $Pi$ of frequency $f$ and wavelength $\lambda$ received from the apertures H1–H8. Total sound pressure $PT$ at the distant point may be expressed by the following equation:

$$PT = \sum_{i=H1}^{i=H8} Pi \qquad \text{Equation (1)}$$

In FIGS. 2 and 3, a vector 40 is shown drawn from the center point 41 of the chamber energy emitting end wall 14 to an exemplary distant point DP. The distant point DP is located distance L from the center point 41, and the distance L is assumed to be significantly larger than the offset distance R of the centerpoints of the apertures H from the axis 16. Hence, the path of the individual pressure waves P$i$ from each of the apertures H to the distant point DP can be considered to be substantially parallel to the vector 40, as shown in FIG. 3.

The angle between vector 40 and the axis 16 is designated alpha ($\alpha$). For convenience, the centerpoints of the apertures H1 and H5 are assumed to lie in the plane 42 defined by the exemplary distant point DP and chamber axis 16. In FIG. 3, the plane of the paper corresponds to the plane 42.

The pressure wave $p$ emitted by any one of the apertures H towards the distant point DP, i.e., along a path parallel to the vector 40, may be expressed as the following rotating phasor:

$$p = (P\cos\alpha)e^{j2\pi ft} \qquad \text{Equation (2)}$$

where $P\cos\alpha$ represents the magnitude at the aperture of the sound pressure wave emitted along the selected path; and $e^{j2\pi ft}$ represents the phase of the pressure wave.

Attenuation, due to distance, absorption and other factors, occurs to the pressure wave emitted from the aperture H as it travels therefrom to the point DP. It has been found that the attenuation factor K can be considered substantially the same for each of the apertures H. Thus, the magnitude of the pressure wave Pi reaching the point DP from any of the apertures H can be expressed as $K(P\cos\alpha)$.

The phase of the pressure wave Pi reaching the point DP from any of the apertures H is a function of the transit time from the specific aperture to the point DP, and hence is a function of the distance the pressure wave must travel to the point DP divided by its wavelength λ. The phase of the pressure wave reaching the point DP from any one of the apertures H can be expressed as $e^{j2\pi(ft + L/\lambda + S/\lambda)}$, where the $L/\lambda$ term is the phase shift due to the transit time required to traverse the distance $L$ and the $S/\lambda$ term is the phase shift due to the angle $\alpha$, which angle causes an additional travel distance $S$ to be associated with specific apertures.

Thus, the pressure wave $Pi$ reaching the point $DP$ from any of the apertures H is expressed by the following equation:

$$Pi = K(P \cos \alpha)e^{j2\pi(ft + L/\lambda + S/\lambda)} \qquad \text{Equation (3)}$$

Equation (3) can be rewritten as follows:

$$Pi = [KPe^{j2\pi(ft + L/\lambda)}][e^{j\,2\pi S/\lambda}]\cos \alpha \qquad \text{Equation (4)}$$

Examining Equation (4), the term $[KPe^{j2\pi(ft + L/\lambda)}]$ is steady state and the same for all apertures H1-H8. Therefore, let $KPe^{j2\pi(ft + L/\lambda)} = U$. Equation (4) can now be written as follows:

$$Pi = Ue^{j\,2\pi S/\lambda}\cos \alpha \qquad \text{Equation (5)}$$

In Equation (5), the $S$ represents the distance along a path parallel to the vector 40 in addition to the distance $L$ which a pressure wave $Pi$ has to travel from a specific aperture H to reach the point DP. The distance $S$ is positive if the specific aperture is located greater than the distance $L$ from the point DP; is negative if the aperture is located closer than the distance $L$ to the point DP; and, is zero if the aperture is located the exact distance $L$ from the point DP.

Referring to FIG. 3, a line 43 is shown drawn through centerpoint 41 perpendicular to the vector 40. By referring to the location of the centerpoints of the apertures H1-H8 relative to the position of the line 43, it can be seen that: the centerpoints of apertures H1, H2, and H8 are located a distance greater than $L$ from the point DP; the centerpoints of the apertures H3 and H7 are located the distance $L$ from the point DP; and, the centerpoints of the apertures H4, H5 and H6 are located closer than the distance $L$ to the point $DP$. Listed below is the distance $S$ calculated for each of the apertures H1-H8.

| Aperture | Distances |
|---|---|
| $H1$ | $R \sin \alpha$ |
| $H2$ | $R/\sqrt{2} \sin \alpha$ |
| $H3$ | 0 |
| $H4$ | $-R/\sqrt{2} \sin \alpha$ |
| $H5$ | $-R \sin \alpha$ |
| $H6$ | $-R/\sqrt{2} \sin \alpha$ |
| $H7$ | 0 |
| $H8$ | $R/\sqrt{2} \sin \alpha$ |

Equation (5), which gives the individual pressure wave $Pi$ arriving at point DP from any aperture H, may now be solved for each of the apertures. Tabulated below are the results.

| Aperture | Pi |
|---|---|
| $H1$ | $PH1 = U e^{j\frac{2\pi R \sin\alpha}{\lambda}} \cos \alpha$ |
| $H2$ | $PH2 = U e^{j\frac{2\pi R \sin\alpha}{\sqrt{2}\,\lambda}} \cos \alpha$ |
| $H3$ | $PH3 = U \cos \alpha$ |
| $H4$ | $PH4 = U e^{-j\frac{2\pi R \sin\alpha}{\sqrt{2}\,\lambda}} \cos \alpha$ |
| $H5$ | $PH5 = U e^{-j\frac{2\pi R \sin\alpha}{\lambda}} \cos \alpha$ |
| $H6$ | $PH6 = U e^{-j\frac{2\pi R \sin\alpha}{\sqrt{2}\,\lambda}} \cos \alpha$ |
| $H7$ | $PH7 = U\cos \alpha$ |
| $H8$ | $PH8 = U e^{j\frac{2\pi R \sin\alpha}{\sqrt{2}\,\lambda}} \cos \alpha$ |

Letting gamma ($\gamma$) equal $$\frac{2\pi R \sin\alpha}{\lambda},$$

the total sound pressure PT in accordance with Equation (1) may be calculated as follows:

$$PT = PH1 + PH2 + PH3 + PH4 + PH5 + PH6 + PH7 + PH8 \qquad \text{Equation (6)}$$

$$PT = U[e^{j\gamma} + e^{j\gamma/\sqrt{2}} + 1 + e^{-j\gamma/\sqrt{2}} + e^{-j\gamma} + e^{-j\gamma/\sqrt{2}} + 1 + e^{j\gamma/\sqrt{2}}] \cos \alpha \qquad \text{Equation (7)}$$

$$PT = U[e^{j\gamma} + e^{-j\gamma} + 2 + 2e^{j\gamma/\sqrt{2}} + 2e^{-j\gamma/\sqrt{2}}] \cos \alpha \qquad \text{Equation (8)}$$

In Equation (8), the following substitutions may be made:

$$2 \cos \gamma = e^{j\gamma} + e^{-j\gamma} \qquad \text{Equation (9)}$$

$$4 \cos \gamma/\sqrt{2} = 2e^{j\gamma/\sqrt{2}} + 2e^{-j\gamma/\sqrt{2}} \qquad \text{Equation (10)}$$

Making these substitutions in Equation (8) yield:

$$PT = U[2 \cos \gamma + 4 \cos \gamma/2 + 2] \cos \alpha \qquad \text{Equation (11)}$$

Equation (11) may be used to calculate the resultant pressure PT produced by the transducer assembly 10 at any specific distance point. Also, Equation (11) can be used to plot the energy pattern radiated by the transducer assembly 10.

Figure 5:
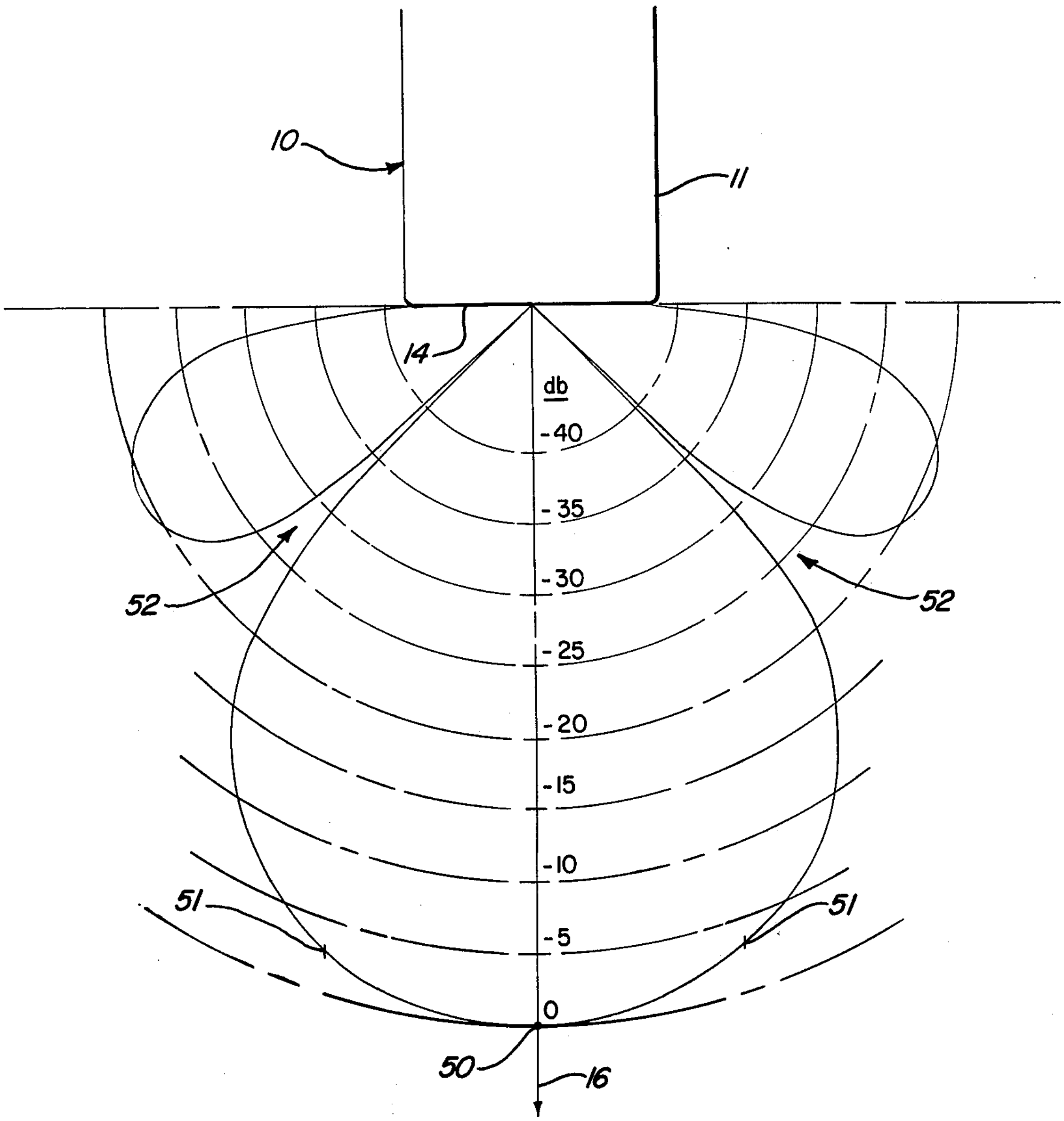
FIG. 5 is a plot of the energy pattern generated by one specific transducer assembly of the type shown in FIG. 1; and, FIG. 6 is a plan view of the energy emitting end wall portion of another transducer assembly according to the present invention.

FIG. 5 shows a plot of the symmetrical energy pattern radiated by a specific transducer assembly constructed like the transducer assembly 10. The specific transducer assembly is constructed to generate sound pressure waves at the ultrasonic resonant frequency of 26.5 KHZ, i.e., a wavelength of 0.5 inches, and has its eight sound emitting apertures offset a radial distance R of 0.2625 inches from the longitudinal axis 16 of the transducer assembly.

Referring to FIG. 5, the circular lines on the energy plot indicate the relative level of the resultant output PT in decibels, the decibel level being indicated at the point the circles cross the axis 16. By using Equation (11) or from the plot shown in FIG. 5, it can be determined that: maximum signal occurs when $\alpha$ is zero, i.e., at point 50 on the axis 16; half power points 51 occur when $\alpha$ equals 18.46°; and a null 52 occurs at $\alpha$ equals 46.8°.

It is noted that if the specific transducer assembly 10 constructed (whose energy plot is shown in FIG. 5) is used in the detection mode, its sensitivity to acoustical energy is the same as the output pattern plotted in FIG. 5.

Figure 6:
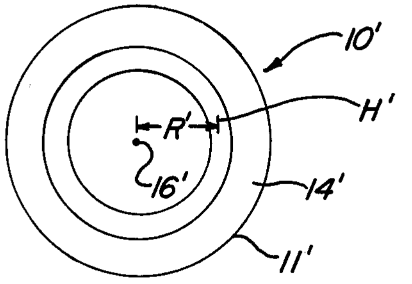

Referring to FIG. 6, an alternate embodiment of transducer assembly 10 according to the present invention is there shown. The construction and operation of the assembly 10' correspond, except for the hereinafter noted exception, to that of the transducer assembly 10. Accordingly, corresponding parts of the transducer assembly 10' are given the same designation with a prime added as used in connection with the assembly 10.

The transducer assembly 10' has the single aperture ring formed by an annular energy emitting aperture H', instead of a series of circular apertures. The annular aperture H' defines a circle at a radius R around and concentric with the longitudinal axis 16' of the resonant chamber 11'. In operation in the active radiating mode, the assembly 10' emits energy through the annular aperture 10' symmetrically around the transducer longitudinal axis 16' at the predetermined radial offset distance R therefrom. The emitted energy sums in a manner like that above described in connection with the transducer assembly 10, to form along and around the selected axis 16' a symmetrical beam-like pattern of controlled width, the beam width being controllable as a function of the offset distance R and the wavelength $\lambda$ of the emitted energy.

It is noted that the size of the apertures H and H' are not critical, but preferably are not larger than $\lambda/2$. Making the apertures larger than $\lambda/2$ would include out of phase components in the energy radiated from the apertures and tend to decrease the output.

It is further noted that while no specific structure is shown in FIG. 6 for supporting the central portion of the end wall 14', such would be included therein. Such support structure could traverse the opening H' and interrupt somewhat its continuity. Nevertheless, the opening H' would be a substantially continuous annular opening.

Thus, there is provided improved transducer assembly and method for radiating and detecting acoustical energy having the advantages of increased efficiency and controlled beam width without the use reflecting and focusing surfaces.

Although, the transducer assemblies herein shown and described are what are conceived to be the most practical and preferred embodiments of the invention, it is recognized that various modifications can be made therein in making a transducer assembly in accordance with the spirit of the invention which operates in an equivalent manner to obtain an equivalent result.

What is claimed is:

1. A transducer assembly for generating and/or detecting acoustical energy at a predetermined frequency over a controlled beam width around a selected axis, said assembly comprising:

a hollow, closed cylindrical resonant chamber having planar end walls and a predetermined resonant frequency, said chamber having a longitudinal axis defined by the center axis of the cylinder which it forms, said longitudinal axis defining said selected axis and said planar end walls being disposed normal to said selected axis, one of said planar end walls having a single aperture ring formed therein through which acoustical energy can be emitted out from and into said chamber, said single aperture ring being symmetrically disposed around said selected axis at a given radial offset distance therefrom; and transducer means mounted within said chamber for generating therein along said selected axis a spherical radiation pattern of acoustical energy at said predetermined frequency.

2. The invention defined in claim 1, wherein said single aperture ring is a plurality of substantially circular openings formed in said planar end wall, said openings being substantially equally spaced apart circumferentially around said selected axis at said given offset distance therefrom.

3. The invention defined in claim 1, wherein said single aperture ring is a substantially continuous annular opening formed in said planar end wall around and concentric with said selected axis at said given offset distance therefrom.

4. The invention defined in claim 1, wherein:

said predetermined frequency is an ultrasonic frequency; and, said transducer means includes a piezoelectric element which resonates at said predetermined ultrasonic frequency.

5. The invention defined in claim 1, wherein:

said predetermined frequency is an ultrasonic frequency; and, said transducer means is positioned substantially symmetrically across the longitudinal axis of said resonant chamber and includes a piezoelectric element which resonates at said predetermined ultrasonic frequency.

6. The invention defined in claim 5, wherein said piezoelectric element is of the flat plate-like bender type.

7. The invention defined in claim 5, wherein said single aperture ring is a plurality of substantially circular openings formed in said planar end wall, said openings being substantially equally spaced apart circumferentially around said selected axis at said given offset distance therefrom.

8. The invention defined in claim 5, wherein said single aperture ring is a substantially continuous annular opening formed in said planar end wall around and concentric with said selected axis at said given offset distance therefrom.

9. The invention defined in claim 7, wherein said piezoelectric element is of the flat plate-like bender type.

10. The invention defined in claim 8, wherein said piezoelectric element is of the flat plate-like bender type.

11. The method of generating a pattern of acoustical energy at a predetermined frequency over a controlled beam width around a selected axis, comprising:

generating along said selected axis a spherical radiation pattern of acoustical energy at said predetermined frequency; and, emitting said spherical radiation pattern of acoustical energy through a single aperture ring formed in wall structure, the wall structure extending across and normal to said selected axis, the single aperture ring being formed in a symmetrical configuration relative to and around said selected axis at a given radial offset distance from said selected axis.

12. The method of claim 11, wherein said spherical radiation pattern of acoustical energy is generated in a resonant chamber.

13. The method of claim 12, wherein the resonant chamber is a cylindrical resonant chamber.

14. The method of claim 11, wherein the single aperture ring is a plurality of substantially circular openings formed in the wall structure, the openings being substantially equally spaced apart circumferentially around said selected axis at said given offset distance therefrom.

15. The method of claim 11, wherein the single aperture ring is a substantially continuous annular opening formed in the wall structure around and concentric with said selected axis at said given offset distance therefrom.

16. The method of claim 12, wherein the single aperture ring is a plurality of substantially circular openings formed in the wall structure, the openings being substantially equally spaced apart circumferentially around said selected axis at said given offset distance therefrom.

17. The method of claim 12, wherein the single aperture ring is a substantially continuous annular opening formed in the wall structure around and concentric with said selected axis at said given offset distance therefrom.

18. The method of claim 16, wherein the resonant chamber is a cylindrical resonant chamber.

19. The method of claim 17, wherein the resonant chamber is a cylindrical resonant chamber.

20. The method of claim 11, wherein said predetermined frequency is ultrasonic.

21. The method of claim 12, wherein said predetermined frequency is ultrasonic.

22. The method of claim 18, wherein said predetermined frequency is ultrasonic.

23. The method of claim 19, wherein the predetermined frequency is ultrasonic.

24. The method of detecting acoustical energy at a predetermined frequency over a controlled beam width around a selected axis, comprising:

positioning a hollow, closed cylindrical resonant chamber along said selected axis with the longitudinal axis of the cylindrical resonant chamber coincident with said selected axis, the resonant chamber being operable to amplify acoustical energy at said predetermined frequency and having piezoelectric transducer means therein operable to generate and hence sense within said resonant chamber along said selected axis a spherical radiation pattern of acoustical energy at said predetermined frequency; and emitting acoustical energy into the resonant chamber through a single aperture ring formed in end wall structure of the resonant chamber normal to said selected axis, the single aperture ring being formed in a symmetrical configuration relative to and around said selected axis at a given radial offset distance from said selected axis.

25. The method of claim 24, wherein the single aperture ring is a plurality of substantially circular openings formed in the wall structure, the openings being substantially equally spaced apart circumferentially around said selected axis at said given offset distance therefrom.

26. The method of claim 24, wherein the single aperture ring is a substantially continuous annular opening formed in the wall structure around and concentric with said selected axis at said given offset distance therefrom.

27. The method of claim 24, wherein said predetermined resonant frequency is ultrasonic.

28. The method of claim 25, wherein said predetermined resonant frequency is ultrasonic.

29. The method of claim 26, wherein said predetermined resonant frequency is ultrasonic.

* * * * *